United States Patent
Gripshover et al.

(10) Patent No.: US 6,483,309 B1
(45) Date of Patent: Nov. 19, 2002

(54) POWER FREQUENCY MAGNETIC FIELD (PF-MF) DETECTION SYSTEMS AND OPERATING METHODS THEREFOR

(75) Inventors: Ronald J. Gripshover, King George, VA (US); Victor H. Gehman, Jr., Dahlgren, VA (US); John C. Wright, King George, VA (US); George R. Walker, Fredericksburg, VA (US); David D. Lindberg, Fredericksburg, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 31 days.

(21) Appl. No.: 09/734,248

(22) Filed: Dec. 11, 2000

(51) Int. Cl.[7] .......................... G01V 3/08; G01V 3/165; G01V 3/16; G01R 33/02; G01R 19/00

(52) U.S. Cl. ............... 324/331; 324/72; 324/117 R; 324/260; 324/345

(58) Field of Search .................. 324/67, 72, 117 R, 324/244, 260, 330, 331, 344, 345, 520–522, 127, 244.1, 248, 251, 252, 258; 340/657, 658, 664

(56) References Cited

U.S. PATENT DOCUMENTS

| | | | | |
|---|---|---|---|---|
| 3,866,111 A | * | 2/1975 | Warren | 324/344 X |
| 4,362,992 A | | 12/1982 | Young et al. | 324/247 |
| 4,471,219 A | | 9/1984 | Giallorenzi | 250/227 |
| 4,587,509 A | | 5/1986 | Pitt et al. | 338/32 H |
| 4,904,940 A | | 2/1990 | Rempt | 324/244 |
| 5,134,362 A | | 7/1992 | Ochi | 324/96 |
| 5,717,388 A | * | 2/1998 | Janoska et al. | 324/117 R X |
| 5,757,283 A | * | 5/1998 | Janoska | 324/260 X |
| 6,229,313 B1 | * | 5/2001 | Seigel | 324/330 X |
| 6,255,825 B1 | * | 7/2001 | Seigel et al. | 324/331 |

FOREIGN PATENT DOCUMENTS

EP 0052053 * 5/1982 ............... 324/331

\* cited by examiner

*Primary Examiner*—Gerard R. Strecker
(74) *Attorney, Agent, or Firm*—James B. Bechtel, Esq.; Raymond H. J. Powell, Jr., Esq.

(57) ABSTRACT

The present invention provides a power frequency, i.e., time-varying, magnetic field (PF-NF) detector system for characterizing the operational condition of a remote facility responsive to time-varying magnetic fields generated by electrical transmission lines associated with the remote facility. The PF-MF detector system advantageously includes a PF-MF sensor which generates N time-varying magnetic field data sets, and a PF-MF analyzer which generates an operational condition assessment responsive to the N time-varying magnetic field data sets, wherein N is an integer greater than or equal to 1. Additionally, the PF-MF detector system includes an accumulator which stores and forwards the N time-varying magnetic field data sets to the PF-MF analyzer via a communications channel. A method for characterizing the operational condition of inaccessible electrical equipment responsive to the time-varying magnetic field generated by a transmission line are also described.

22 Claims, 6 Drawing Sheets

POWER FREQUENCY MAGNETIC FIELD (PF-MF) DETECTION SYSTEMS AND OPERATING METHODS THEREFOR

STATEMENT OF GOVERNMENT INTEREST

The invention described herein was made in the performance of official duties by employees of the Department of the Navy and, thus, may be manufactured, used, licensed by or for the Government of the United States of America for governmental purposes without the payment of any royalty thereon or therefor.

BACKGROUND OF THE INVENTION

The present invention relates generally to time-varying magnetic field detection. More specifically, the present invention relates to systems and corresponding methods for gathering intelligence information based on power frequency, i.e., time-varying, magnetic field measurements and subsequent analysis. The systems and corresponding methods are particularly advantageous for ascertaining the operational status of electrical equipment before and after an event, e.g., a bombing run.

Whenever an electric current flows, a magnetic field is generated. When alternating current, such as that produced by a generator, flows, time-varying magnetic fields of the same frequency are generated and propagate away from the current source. These time-varying magnetic fields travel at the speed of light and can be detected at large distances from the current source. The time-varying magnetic fields generated by transmission and distribution lines may be detected and used to calculate the position, and amplitude of the current source.

As discussed in U.S. Pat. No. 5,525,901, there are a variety of sensors known in the art for use in measuring magnetic fields, such as Hall effect sensors, proton superconducting quantum interference detectors (SQUID), fluxgate magnetometers, inductive pickup sensors, magnetoresistive sensors, and others. For example, Hall effect sensors make use of the property of a current-carrying semiconductor membrane (Hall element) of generating a low voltage perpendicular to the direction of current flow when subjected to a magnetic field normal to its surface. In contrast, magnetoresistive sensors make use of a magnetoresistive effect which is a property of a current-carrying magnetic material to change its resistivity in the presence of an external magnetic field. This change is brought about by rotation of the magnetization relative to the current direction. Depending upon the application, one or another of the above sensors may be chosen for a particular magnetic field measurement. See, also, U.S. Pat. No. 5,777,470, which discloses a compensated coil EMF detector.

U.S. Pat. No. 5,130,655 discloses a multiple-coil magnetic field sensor with series-connected main coils and parallel-connected feedback coils, which is typically employed in subsurface geophysical exploration. In operation, the induced fields generated by an external source penetrate the regions within the coils, and induce voltages proportional to the rate of change of the magnetic field (dB/dt). It is, however, known to provide a direct measurement of magnetic field by use of a feedback coil associated with, and magnetically coupled to, the detector's main coil. In short, the main coil is coupled to the input terminal of the amplifier, and an output signal is applied to the feedback coil, which coil operates to cancel the magnetic field through the main coil. Thus, the main coil becomes a null detector and the feedback current is linearly proportional to the magnetic field.

Military applications of magnetic field detector systems have generally been confined to applications such as magnetic anomaly detection (MAD) systems, which detect changes in the background magnetic flux associated with large masses of metal. Antisubmarine warfare (ASW) aircraft often trail a MAD sensor, as discussed in U.S. Pat. No. 3,697,869. However, the MAD sensor does not provide the ASW aircraft with any indication of the operational condition of the submarine; additional sensors such as sonabuoys are employed to characterize the condition of the submarine once it has been located.

With the introduction of "precision weapons," it has become very difficult to perform conventional battle damage assessment, i.e., to determine whether the facility has been physically destroyed, because these precision weapons leave much of the structure intact. For example, when a smart bomb enters a bunker via one of its ventilation shafts, the bunker looks the same in before and after photos. Thus, even when the bunker has been destroyed by the first of several weapons assigned to the bunker, there is no rapid and reliable method by which to determine that the bunker has been neutralized to thereby allow the retargeting of backup weapons to secondary targets. As these precision weapons are further developed, and as the requirements with respect to collateral damage become more stringent, new ways of determining the operating status of equipment are needed.

Another serious problem is to locate and determine the types of operations in hidden (usually underground) facilities. These facilities are often used in the manufacture or storage of weapons of mass destruction. Additionally, locating drug processing laboratories in dense jungle cover is very difficult; these labs are hidden to most sensors (optical, infrared, most RF detectors) by the jungle canopy and the frequently associated cloud cover.

Power frequency magnetic field detection advantageously can be used first to locate and then to monitor the operations in these remote facilities. However, a method and corresponding system for determining the operating condition of a hidden facility based on the time-varying magnetic signature of electrical equipment or electrical power lines supplying that electrical equipment has not previously been proposed.

What is needed is a system and corresponding method for determining and/or inferring the operational condition of a remote facility based on the power frequency magnetic field generated by the remote facility. What is also needed are a system and corresponding method for determining and/or inferring the operational condition of a remote facility based on the power frequency magnetic field generated by the power line(s) supplying electricity to that facility. It would be beneficial if the system and corresponding method could be employed for gathering intelligence regarding the remote facility based on the power frequency magnetic field generated by the remote facility or the power being supplied to that remote facility. It will be appreciated that the intelligence information derived from the system and corresponding methods for determining changes in power frequency magnetic field are not limited to time-varying magnetic fields generated by the fixed remote facility.

It should be mentioned at this juncture that all of the above-identified patents are incorporated herein by reference.

SUMMARY OF THE INVENTION

Based on the above and foregoing, it can be appreciated that there presently exists a need in the art for a power frequency, i.e., time-varying, magnetic field (PF-MF) detector and method of operation therefor which overcomes the above-described deficiencies. The present invention was motivated by a desire to overcome the drawbacks and shortcomings of the presently available technology, and thereby fulfill this need in the art.

According to one aspect, the present invention provides a power frequency, i.e., time-varying, magnetic field (PF-MF) detector system for characterizing the operational condition of a remote facility responsive to time-varying magnetic fields generated by electrical transmission lines associated with the remote facility. The PF-MF detector system advantageously includes a PF-MF sensor which generates N time-varying magnetic field data sets, and a PF-MF analyzer which generates an operational condition assessment responsive to the N time-varying magnetic field data sets, wherein N is an integer greater than or equal to 1. Additionally, the PF-MF detector system includes an accumulator, which stores and forwards the N time-varying magnetic field data sets via a communications channel that electrically couples the accumulator to the PF-MF analyzer. In an alternative configuration, the PF-MF detector system includes an accumulator operatively coupled to the PF-MF analyzer, which accumulator stores and forwards the N time-varying magnetic field data sets to the PF-MF analyzer, and a communications channel operatively coupling the PF-MF sensor to the accumulator.

In another aspect, the present invention provides a method for detecting the operational status of electrical equipment disposed at a remote location responsive to power frequency magnetic field (PF-MF) data generated by at least one electrical source providing power to the electrical equipment. Preferably, the method includes steps for obtaining a series of N time-varying magnetic field data sets corresponding to the time-varying magnetic fields generated by the electrical source, and analyzing the N time-varying magnetic field data sets to thereby produce an operational condition to assessment regarding the electrical equipment, where N is an integer greater than or equal to 1.

According to a further aspect, the present invention provides a method for detecting the operational status of electrical equipment disposed at a remote location responsive to power frequency magnetic field (PF-MF) data generated by a PF-MF sensor disposed within the time-varying magnetic field generated by at least one electrical source providing power to the electrical equipment, comprising steps of moving the PF-MF sensor relative to the electrical source, obtaining a series of N time-varying magnetic field data sets corresponding to the time-varying magnetic fields generated by the electrical source, and analyzing the N time-varying magnetic field data sets to thereby produce an operational condition assessment regarding the electrical equipment, where N is an integer greater than or equal to 1.

BRIEF DESCRIPTION OF THE DRAWINGS

These and various other features and aspects of the present invention will be readily understood with reference to the following detailed description taken in conjunction with the accompanying drawings, in which like or similar numbers are used throughout, and in which.

DETAILED DESCRIPTION OF THE PREFERRED EMBODIMENTS

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The power frequency, i.e., time-varying, magnetic field (PF-MF) detection system and operating method therefor utilize the knowledge that whenever currents flow in electrical equipment, time-varying magnetic fields are generated which propagate away from the electrical equipment. Common materials, e.g., rock, foliage, earth, and most building materials, do not appreciably attenuate these time-varying, low frequency magnetic fields. The present invention takes advantage of the fact that accurate measurements can be obtained that advantageously can be used to determine status of the electrical equipment for various purposes, e.g., to perform battle field assessment for military purposes, to locate isolated power sources (e.g., drug processing labs in dense jungle cover), to locate and determine the operational status of underground facilities, and to determine the status of other various electrical equipment for other desired purposes.

It will be appreciated that whenever current flows in equipment or through electrical conductors, time-varying magnetic fields of the same frequency are generated. These time-varying magnetic fields travel at the speed of light and can be detected at large distances from the source current. It will also be appreciated that the time-varying magnetic fields decay away as soon as the source current(s) generating the time-varying magnetic field are interrupted. Hence, if the power-frequency time-varying magnetic fields suddenly decrease, i.e., go to zero, near a power component, it is reasonable to infer that the component is no longer operating.

Some of the salient characteristics of the power-frequency time-varying magnetic field detection are that the detection is the direct result of power in the component. This leads to an instantaneous response and hence no time lag for such detection. The PF-MF sensor used to detect these time-varying magnetic fields advantageously can be made to respond only to currents at selected power frequencies; other time-varying magnetic fields at higher frequencies, e.g., those time-varying magnetic fields generated associated with radar and communication system, represent little interference with respect to power frequency magnetic field detection.

Figure 1:
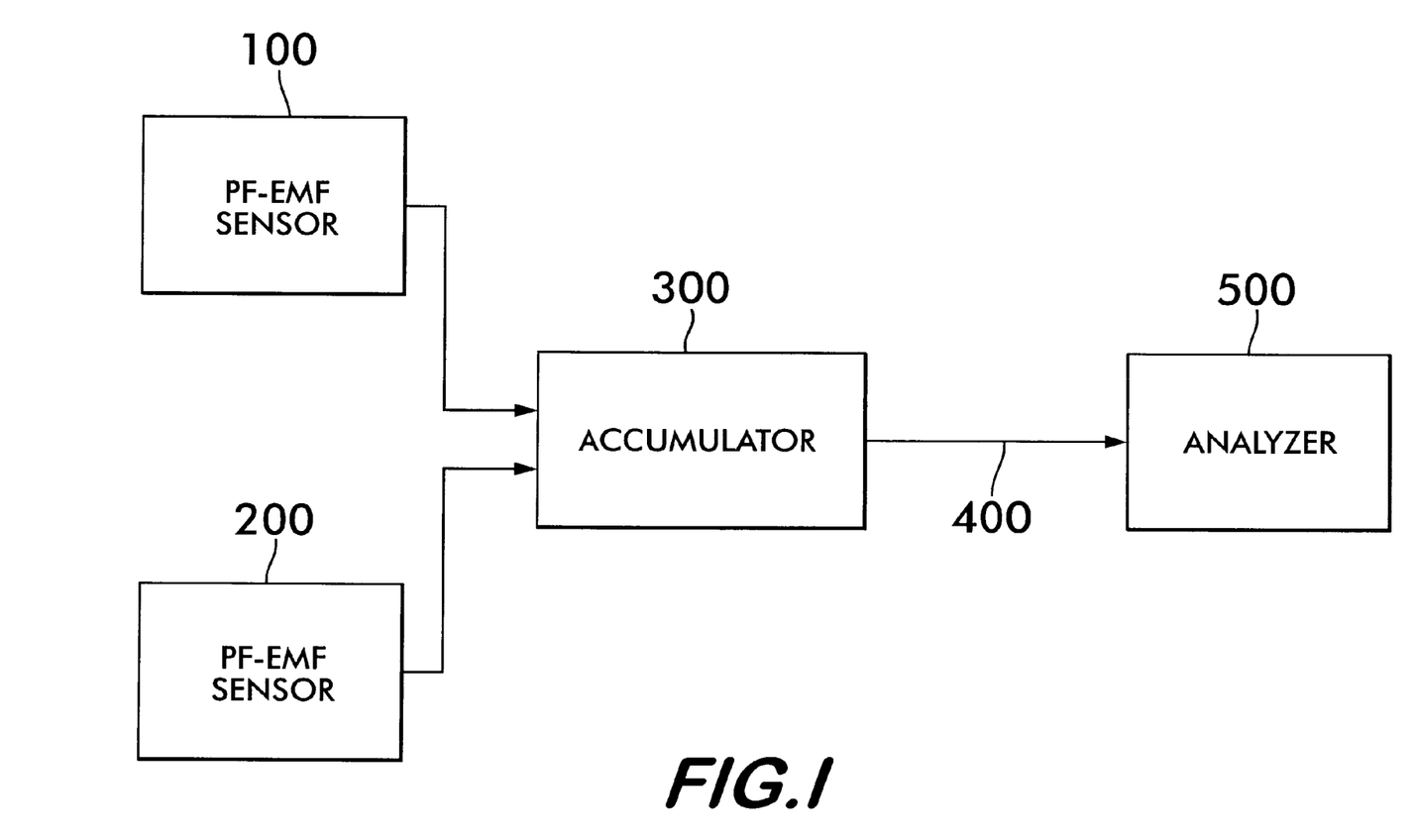
FIG. 1 is a high-level block diagram of a power frequency, i.e., time-varying, magnetic field detector system according to the present invention.

FIG. 1 is a high-level block diagram of an exemplary PF-MF detector system, which advantageously includes a PF-MF sensor 100, an optional PF-MF sensor 200, a data accumulator 300, which stores and forwards time-varying magnetic field data generated by the sensor(s) 100 (200) to an analyzer 500 via a communications (comm) channel 400. Accumulator 300 preferably is a hard disk storage device, although accumulator 300 advantageously can be a tape recorder, a static random access memory (SRAM), an optical storage device, or virtually any other type of nonvolatile memory.

It will be appreciated that the order of the components 300 and 400 advantageously can be interchanged, i.e., the data can be accumulated by accumulator 300 and then sent as a data burst over the comm channel 400, e.g., a spread spectrum communications link, or sent in real time over the comm channel 400 and then accumulated prior to analysis. It will also be noted that the PF-MF detector system includes at least one PF-MF sensor 100; additional sensors can be employed to facilitate analysis of the time-varying magnetic field source, e.g., deploying a series of sensors proximate to a bridge to determine the number and direction of vehicles crossing the bridge.

It should be mentioned that the PF-MF sensor(s) 100 (200) advantageously can be one of the Hall effect sensors, proton superconducting quantum interference detectors (SQUID), fluxgate magnetometers, inductive pickup sensors, magnetoresistive sensors mentioned above. The actual selection depends on, among other things, whether the application calls for proximate, i.e., adjacent to the time-varying magnetic field source, remote, i.e., within several 1000 yards (yds) of the time-varying magnetic field source, or airborne, i.e., greater than several hundreds of feet vertical, placement of the PF-MF sensor. It will be appreciated that the separation between the PF-MF sensor and the time-varying magnetic field source dictates, to some extent, the size of the accumulator 300, since a PF-MF sensor located thousands of yards from, e.g., high above, the time-varying magnetic field source will generally require a large number of data points to separate the time-varying magnetic field source of interest from background magnetic "noise," as discussed in greater detail below.

It should also be mentioned that the intelligence information developed by the PF-MF detector system can of several types. For example, when a single power line supplies a remote facility and that remote facility is destroyed, the time-varying magnetic field measured by the PF-MF detector system drops to approximately zero from some previous level almost immediately. Alternatively, the same sensor detector system can be used to monitor the remote facility over a predetermined time period to ascertain equipment usage patterns, allowing mission planning personnel to determine the time when the occupants of the remote facility are least likely to be alert. In addition, further analysis of the data obtained by the PF-MF detector system advantageously can permit characterization of the equipment disposed in the remote facility.

The exemplary deployment options mentioned above will now be described in greater detail with reference to FIGS. 2–8. It will be appreciated that the discussion which follows presents both tactical deployment scenarios and actual test data, when feasible.

Figure 2:
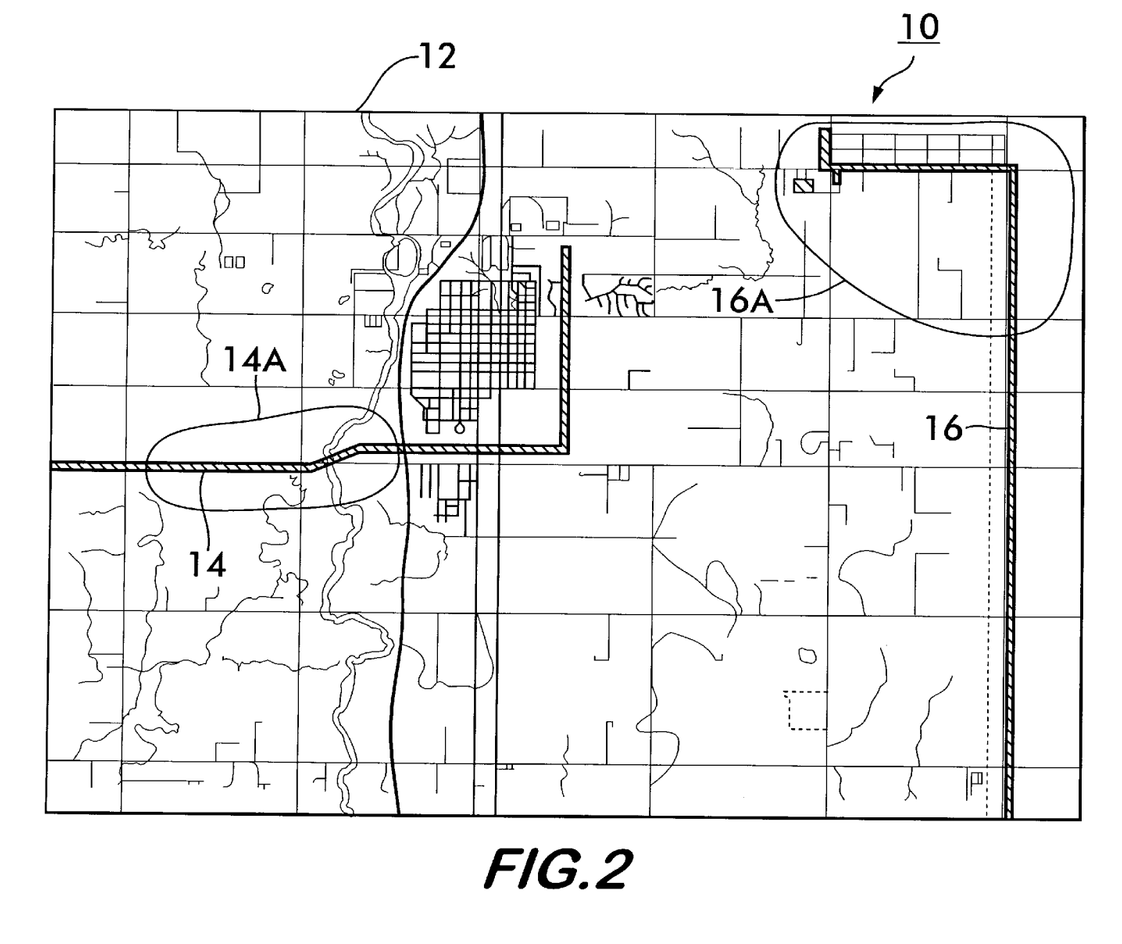
FIG. 2 illustrates a typical city map having identified thereon typical power distribution systems.

FIG. 2 is a map 10 representing a part of an area, such as a residential city, defined by a boundary 12 along the perimeter of the map 10. Electric transmission lines associated with the city are identified by the use of reference numbers 14 and 16. Particular regions of transmission lines 14 and 16 are respectively identified in map 10 by the use of the nomenclature 14A and 16A. It will be appreciated that region 14A of transmission line 14 is relatively flat and has a slightly uprising portion at one of its ends. Similarly, region 16A of the transmission line 16 is made up of relatively straight portions that merge together.

The present invention advantageously can be employed to identify the operational status of electrical equipment, such as the transmission lines 14 and 16, by detecting and measuring the time-varying magnetic fields generated by the current flowing from within, or into the equipment 14 and 16, as discussed in greater detail below. In particular, the operational status detectable by time-varying magnetic fields of transmission lines 14 and 16 may be fully described with reference to FIG. 3.

Figure 3:
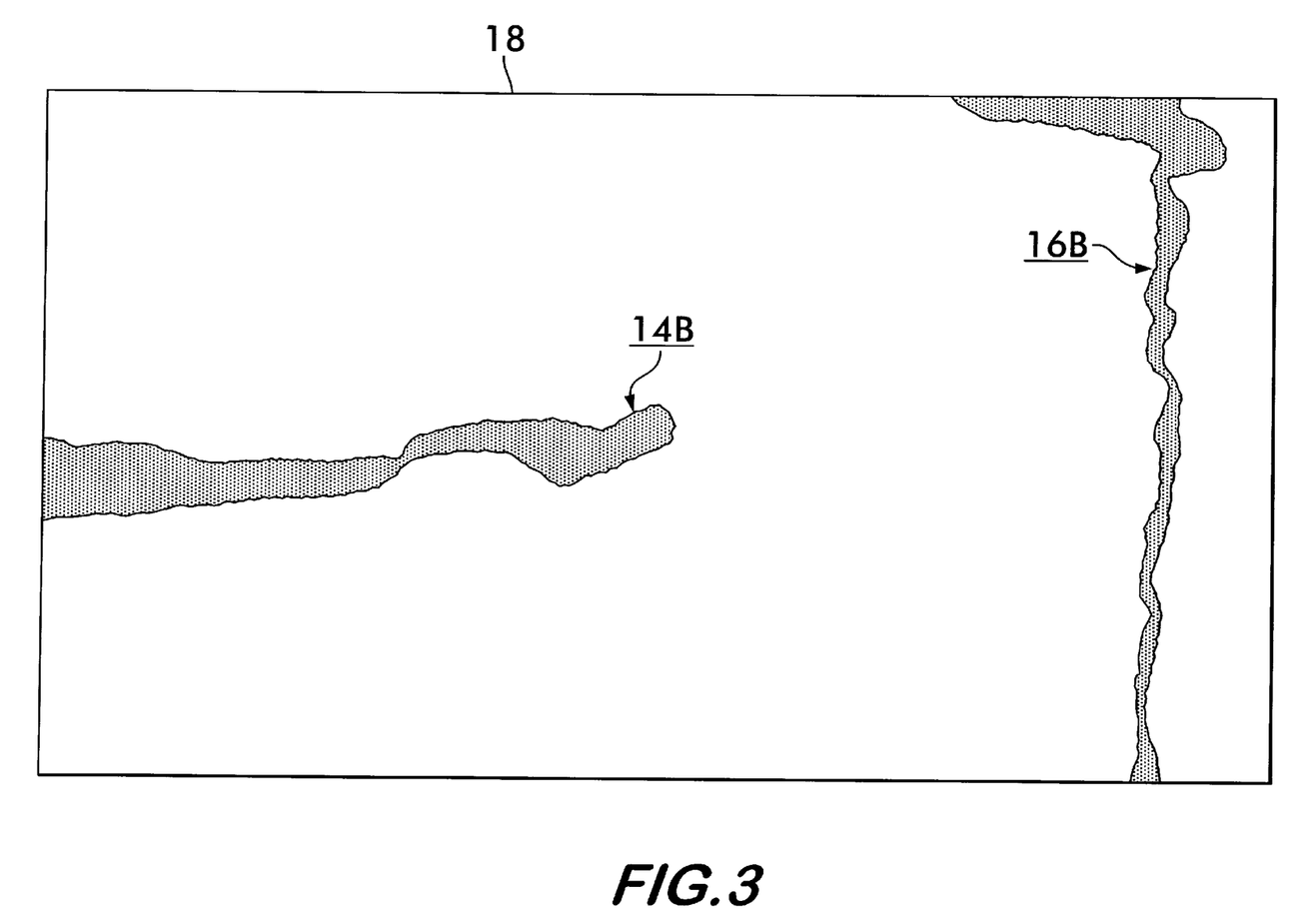
FIG. 3 illustrates a time-varying magnetic field distribution associated with the city map of FIG. 2 measured at an elevation of about 1,000 ft. above the city outlined in FIG. 2.

The plots illustrated in FIG. 3 represent time-varying magnetic field data taken over the city represented by map 10 at an altitude of approximately one (1) thousand feet. In particular, the collected time-varying magnetic field data represented by portion 14B is that created by current flow in region 14A of the transmission line 14; similarly, the collected time-varying magnetic field data represented by portion 16B of FIG. 3 is that created by the current flow in region 16A of the transmission line 16. A comparison of FIGS. 2 and 3 reveals that the contours of portions 14B and 16B are respectively quite similar to the contours of regions 14A and 16A.

It will be appreciated that the PF-MF sensor 100 of the PF-MF detector system advantageously can be disposed in several different locations, only one of which, airborne, is illustrated with respect to FIGS. 2 and 3. For example, the PF-MF sensor 100 can be disposed directly under the power transmission lines 14 or 16. It should be mentioned that the PF-MF sensor 100 can be placed anywhere along the transmission line between the generator and the remote facility of interest. However, it should be noted that placement of the PF-MF sensor 100 in a region free from other power sources will minimize time-varying magnetic field background noise. Experimental readings obtained with an Emdex II EMF meter manufactured by Enertech Consultants confirm the feasibility of this approach. It will be appreciated that the PF-MF sensor can be camouflaged to permit covert placement. Alternatively, a PF-MF sensor having a greater sensitivity advantageously could be disposed within several hundreds or thousands of yards of the transmission lines 14, 16. Experiments conducted utilizing an Imagem EMF sensor have confirmed that this approach is also feasible, i.e., the PF-MF sensor can be located up to several miles from the monitored equipment in the remote facility and/or its power source (depending on the strength of the source), thereby permitting more covert data collection.

As discussed with respect to FIGS. 2 and 3, the PF-MF sensor 100 advantageously can be airborne, e.g., mounted in a pod coupled to or towed from an airplane. FIG. 3 represents time-varying magnetic field data gathered from a low flying airplane. Experiments conducted in connection with exemplary embodiments of the present invention were also performed to gather data of time-varying magnetic fields generated by a 345 kV power-transmission line as a function of altitude, as discussed immediately below with respect to FIG. 4.

Figure 4:
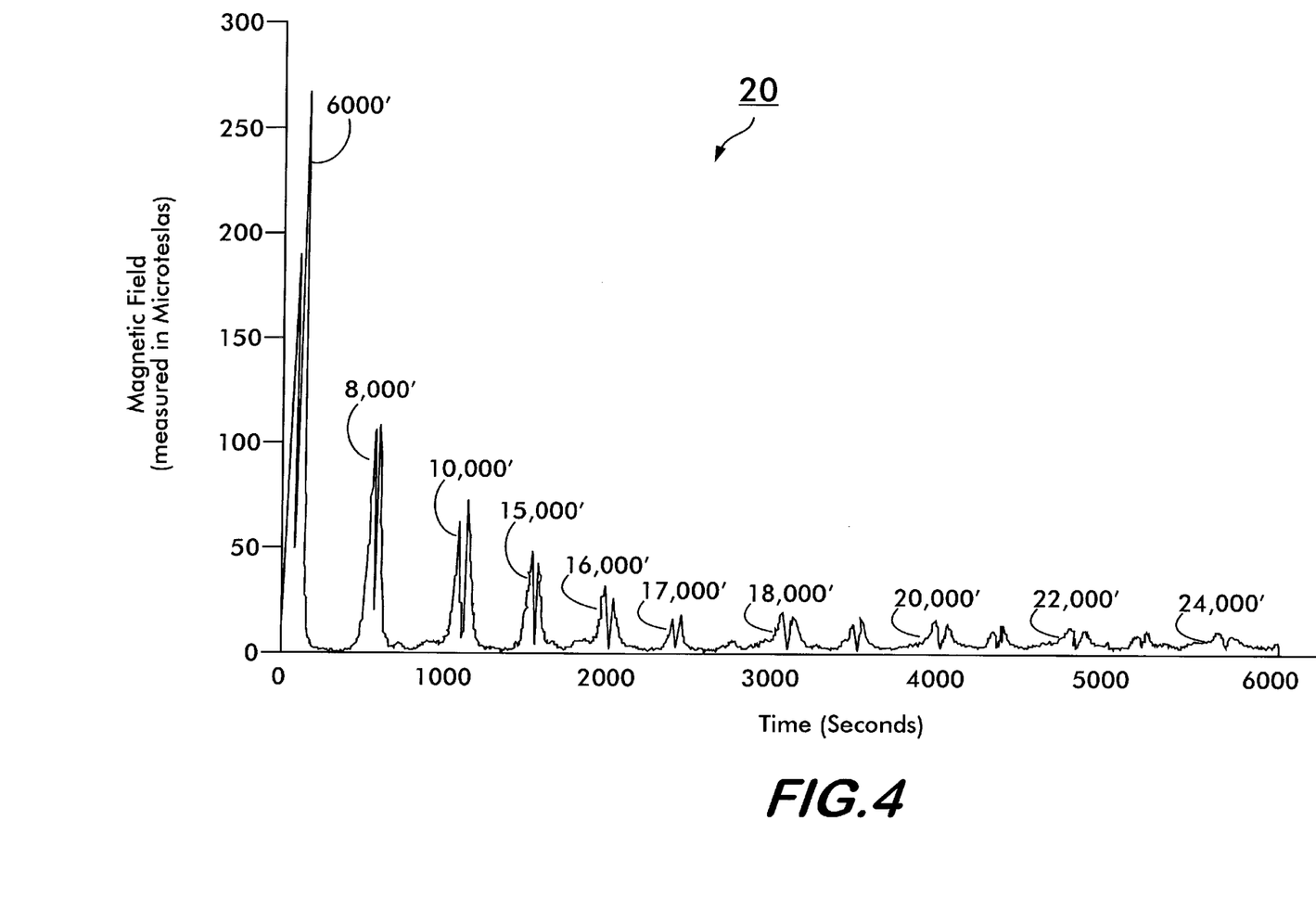
FIG. 4 is a plot of the time-varying magnetic field measured above a typical overhead power line.

FIG. 4 illustrates a family of plots 20 having an X axis given in time (seconds) and a Y axis representing a time-varying magnetic field measured by an airborne vehicle, to be described, and given microtesla units. Data for this chart was acquired by having the aircraft fly in an ascending spiral, thereby flying over the power line at an altitude which increases as a function of time. The family of plots 20 comprises peak portions each indicative of the measured time-varying magnetic field at the respective altitude shown in FIG. 4. A review of FIG. 4 reveals that the level of the time-varying magnetic field generated by the flow of current in a power-transmission line is correlatable to altitude within a certain degree of certainty. It will also be appreciated that the time needed to separate the time-varying magnetic field of interest from background time-varying magnetic field "noise" increases as a function of altitude.

Figures 5, 6:
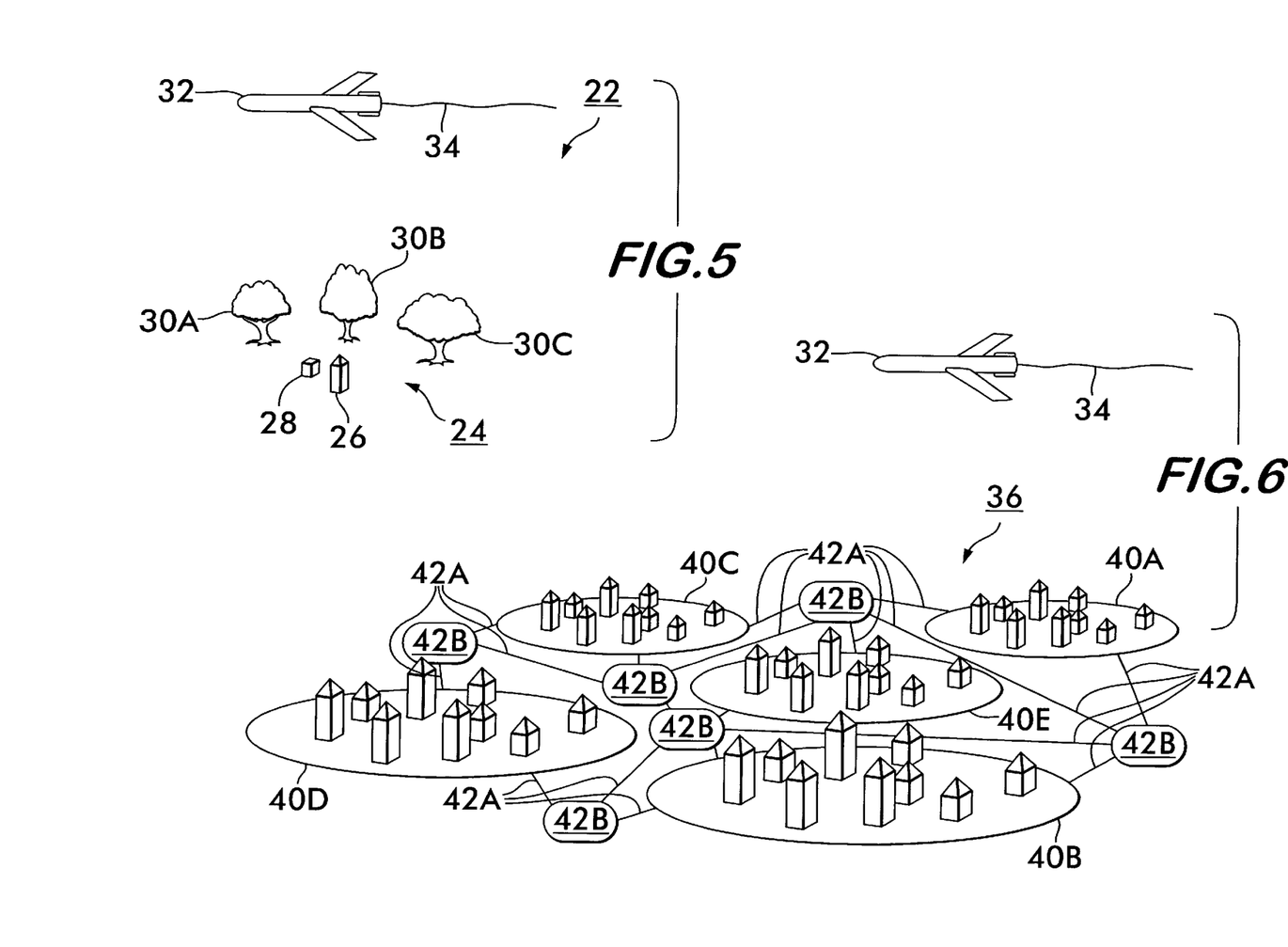
FIG. 5 illustrates a remote location having a power source whose operational status is detectable by the practice of the present invention.
FIG. 6 illustrates a schematic of a typical residential city whose operational status of its electrical equipment is detectable by the practice of the present invention.

The utilization of time-varying magnetic field data to determine the operational status of electrical equipment finds many usages, one of which may be more fully appreciated by referring to FIG. 5, which illustrates a surveillance event 22 wherein an aircraft 32 utilizing a PF-MF sensor 100 searches for remote facilities below a jungle canopy. More specifically, FIG. 5 illustrates a remote location 24 having a test site 26, i.e., a site used to produce an illegal substance, such as drugs, and a power system represented by an electrical generator 28. Both the site 26 and the generating equipment 28 are hidden under dense foliage represented by trees 30A, 30B and 30C. FIG. 5 further illustrates an airplane 32 carrying a PF-MF sensor 34, e.g., a wire coil, which is used to gather time-varying magnetic field data. The experimentation confirmed that 60 Hz time-varying magnetic fields could be detected from a sensor 34 carried by an airplane 32.

More specifically, numerous tests were conducted over a simulated drug-processing site 26 located in a remote area 24. The test site 26 was powered by a 4 kW Portable generator, i.e., generator 28, which generated approximately 20 Amps at 120 Volts. The generator 28 was connected to resistive loads through three rectangular current loops. It should be noted that the 4 kW Portable generator 28 is an order-of-magnitude smaller than generators typically used in moderate-to-large drug-processing laboratories. It should also be mentioned that ground resistivity measurements were performed during the experimentation to characterize the earth response, i.e., to facilitate calculations of the image currents in the partially conducting earth. These measurements were necessary for theoretical calculations of the 60-Hz response created from loop current sources. The experimentation was conducted in three stages.

The first stage of the experimentation was performed using a single current loop, having an 8-inch separation and a length of approximately 100 feet. More particularly, this single current loop was a loop of wire with 23.5 amperes flowing through it. The 8-inch separation was chosen because it is a typical wiring separation in such processing facilities. Time-varying magnetic field measurements were made on the ground around the loop with the hand-held Emdex II sensor mentioned above, as well as at altitudes of 300 ft., 1000 ft., and 6000 ft. Preliminary data indicate that the time-varying magnetic field was detectable at 300 ft., but that the response for the higher altitudes was in the noise range of the PF-MF detector system.

Since the time-varying magnetic field from the single current loop could be detected at close range, i.e., 300 ft., but not longer ranges, the second stage of the experimentation employed a rectangular current loop which was 10 meters (about 33 feet) by 27 meters (about 88 feet). This rectangular current loop included ten turns of wire so the equivalent current flowing therein was 195 amperes (10×19.5 amperes).

Again, 60 Hz time-varying magnetic field measurements were made at ground level with the hand-held Emdex II sensor at various positions around the loop and at various times during the flights by an airborne PF-MF sensor 34. Measurements from the airborne sensor 34 on the airplane 32 were obtained during six passes over the test site 26 from: 200 ft.; 300 ft.; 1000 ft.; 2000 ft.; and 4000 ft.; and 6000 ft. Acceptable time-varying magnetic field data was obtained to 2000 ft., at 4000 ft. the response was in the noise range of the PF-MF detector sensor.

To further bracket the performance of the experimental PF-MF detector system, third stage testing was then performed utilizing a four-turn single current loop, i.e., a current loop having a 8-inch separation and a length of 100 ft. However, rather than the single turn used in the first stage of the experiment, the third stage of experimentation employed a loop having four turns of wire, which produced equivalent current of 76.4 Amps (4×19.1 Amps). This configuration was chosen to attempt to get data which more closely simulates actual currents (~80 amperes) expected in a processing laboratory complex, such as test site 26. Again ground level measurements of the 60-Hz fields were obtained using the hand-held Emdex II sensor. Third stage measurements using the airborne PF-MF sensor 34 were obtained from each of six passes over the test site 26 at the following altitudes: 50 ft.; 100 ft.; 200 ft.; and 400 ft. Useable time-varying magnetic field data was obtained from each of these tests. After obtaining acceptable time-varying magnetic field data, the current flowing in the four-turn current loop was then decreased (by increasing the resistance of the load) to 10 amperes (equivalent to~40 Amps.) and time-varying magnetic field data was again taken at ground level and again at altitudes of 50 ft., 100 ft., 200 ft., and 400 ft. Again useable data was obtained in all overflights of the test site 26.

The use of an airborne platform, such as that provided by the low-flying airplane 32, to gather time-varying magnetic field data as a function of elevation to thereby ascertain the operational status of the remote facility based on the operational status of the facilities electrical equipment may be further understood by describing the operation with respect to FIG. 6, which illustrates a relatively large military installation 36 having a plurality of industrial sites 40A, 40B, 40C, 40D, and 40E. These industrial sites are interconnected by a plurality of distribution lines 42A, each having an associated distribution switching network 42B. The operational status of the electrical equipment of the military installation 36 is determined by transporting the PF-MF sensor 34 using the airplane 32, previously discussed with reference to FIG. 5, and measuring the time-varying magnetic fields. The resultant time-varying magnetic field data is presented in FIG. 7.

Figure 7:
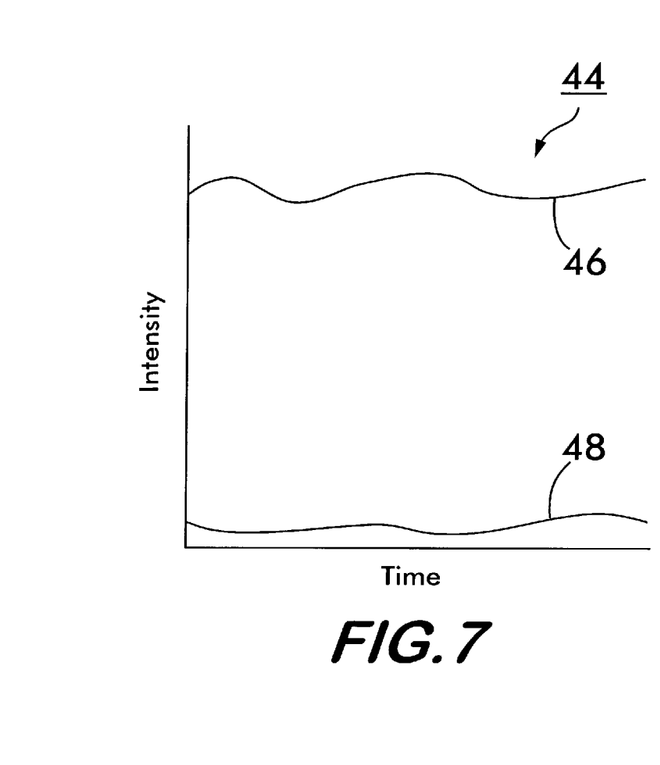
FIG. 7 generally illustrates a plot related to the detection of FIG. 6.

FIG. 7 is a conceptual illustration of a set of plots 44 comprised of two plots 46 and 48. The plot 46 represents time-varying magnetic fields created by operational electrical equipment of a military installation 36. The plot 46 would be obtained by carrying the PF-MF sensor 34, installed in airplane 32, over the military installation 36 so as to provide a gross value of the background 60 Hz time-varying magnetic field. After the military installation 36 has encountered destructive military strike, the airplane 32 would then fly over the military installation 36 again to obtain a second time-varying magnetic field profile, i.e., a time-varying magnetic field data set. It will be appreciated that, if the military strike was successful, the PF-MF sensor 34 will sense a precipitous drop in the 60 Hz time-varying magnetic field intensity as indicated by plot 48. It will also be appreciated the PF-MF detector system and corresponding method advantageously can detect whether the complete electrical equipment or only some of the major components of the electrical equipment are operating successfully.

Figure 8:
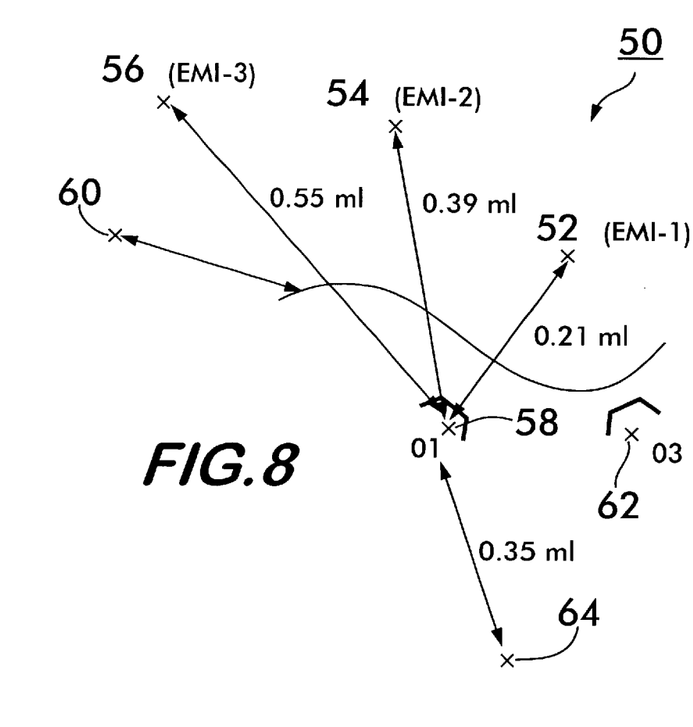
FIG. 8 illustrates locations for detecting the time-varying magnetic fields created by remotely located electrical equipment.

FIG. 8 illustrates another embodiment, i.e., a configuration 50, by which the PF-MF detector system according to the present invention may be practiced, i.e., a configuration which allows the PF-MF sensor to be located at a considerable distance from both the electrical equipment being characterized and its power sources. In order to verify that acceptable operation for the configuration 50, an exemplary embodiment of the present invention utilized a PF-MF sensor manufactured by ElectroMagnetic Instruments, Inc. (EMI) (commonly referred to as an Imagem system) that was positioned at locations 52, 54, and 56. This exemplary PF-MF sensor measured three components of an time-varying magnetic field. The sensitivity of the PF-MF sensor was better than one picotesla per Hertz at 60-Hz. The PF-MF sensor was placed at locations 52, 54, and 56 all relative to an underground facility (UGF) 58. More particularly, the locations 52, 54, and 56 were approximately 0.21 miles; 0.39 miles; and 0.55 miles, respectively, relative to location 58. During this testing, approximately 8000 data points were gathered, which time-varying magnetic field data indicated that the time-varying magnetic field characterizing the UGF 58 could be reliably detected within a range of approximately 0.40 miles.

It should now be appreciated that the practice of the present invention provides a method for measuring magnetic fields that are created by the flow of current into and out of electrical equipment so as to determine the operational status of the electrical equipment measured. Power frequency magnetic fields which are generated by the currents used to power the processing machinery are not appreciably attenuated by the canopy or clouds; hence, an airborne platform with a power frequency sensor could rapidly survey large geographic areas for suspicious activities.

In general, the present invention provides a system and corresponding method for detecting the operational status of electrical equipment at a location at or below ground level. For such detection, the electrical equipment receives or generates a flow of current at a first frequency range, which, in turn, generates corresponding time-varying magnetic fields. The present invention includes a sensor that detects and measures the time-varying magnetic fields within a predetermined frequency range, such as between 40 and 800 cycles. In operation, the sensor is positioned at a predetermined distance from the electrical equipment and the power frequency magnetic fields detected at that predetermined distance, which are representative of the status of the electrical equipment, are analyzed.

It should be mentioned that power frequency magnetic field detection can also be used to monitor the operating status of other infrastructure systems such as Petroleum, Oil and Lubrication (POL) and Lines-of-Communication (LOC). POL systems usually have large electrically powered pumps to move their products; the power frequency magnetic fields generated by the currents used to power these pumps can be detected, thereby providing an indication of their operation. LOC systems, especially trains, are frequently electrically powered; the power frequency magnetic fields from the currents used to power the train can be detected and provide an indication of their operational status.

In summary, the present invention provides a power frequency magnetic field (PF-MF) detector system for characterizing the operational condition of a remote facility responsive to time-varying magnetic fields generated by electrical transmission lines associated with the remote facility. The PF-MF detector system advantageously includes a PF-MF sensor which generates N time-varying magnetic field data sets, and a PF-MF analyzer which generates an operational condition assessment responsive to the N time-varying magnetic field data sets, wherein N is an integer greater than or equal to 1. Additionally, the PF-MF detector system includes an accumulator, which stores and forwards the N time-varying magnetic field data sets, via a communications channel that electrically couples the accumulator to the PF-MF analyzer.

In an alternative configuration, the PF-MF detector system includes an accumulator operatively coupled to the PF-MF analyzer, which accumulator stores and forwards the N time-varying magnetic field data sets to the PF-MF analyzer, and a communications channel operatively coupling the PF-MF sensor to the accumulator. Thus, when the PF-MF detector system is mounted in an aircraft, the accumulator advantageously can be a tape recorder, and the communications channel can be a cable connecting the PF-MF sensor to the accumulator.

It will be appreciated that the PF-MF detector system can include first and second PF-MF sensors generating N and M time-varying magnetic field data sets. In that exemplary embodiment, the accumulator stores and forwards the N+M time-varying magnetic field data sets to the PF-MF analyzer via a communications channel electrically coupling the accumulator to the PF-MF analyzer, which generates the operational condition assessment responsive to the N+M time-varying magnetic field data sets. It should be noted that M is an integer greater than or equal to 1.

Moreover, the present invention provides a method for detecting the operational status of electrical equipment disposed at a remote location responsive to power frequency magnetic field (PF-MF) data generated by at least one electrical source providing power to the electrical equipment. Preferably, the method includes steps for obtaining a series of N time-varying magnetic field data sets corresponding to the time-varying magnetic field generated by the electrical source, and analyzing the N time-varying magnetic field data sets to thereby produce an operational condition assessment regarding the electrical equipment, where N is an integer greater than or equal to 1.

Furthermore, the present invention provides a method for detecting the operational status of electrical equipment disposed at a remote location responsive to power frequency magnetic field (PF-MF) data generated by a PF-MF sensor disposed within the time-varying magnetic field generated by at least one electrical source providing power to the electrical equipment, comprising steps of moving the PF-MF sensor relative to the electrical source, obtaining a series of N time-varying magnetic field data sets corresponding to the time-varying magnetic field generated by the electrical source, and analyzing the N time-varying magnetic field data sets to thereby produce an operational condition assessment regarding the electrical equipment, where N is an integer greater than or equal to 1.

In an exemplary embodiment, the PF-MF sensor is vertically separated from the electrical source by a predetermined distance. In that case, it will be appreciated that the number N of time-varying magnetic field data sets required to determine the operational status of the electrical equipment increases as the predetermined distance increases. In other words, the data required to separate time-varying magnetic field data from other magnetic field noise increases as the time-varying magnetic field strength decreases.

Although presently preferred embodiments of the present invention have been described in detail hereinabove, it should be clearly understood that many variations and/or modifications of the basic inventive concepts herein taught, which may appear to those skilled in the pertinent art, will still fall within the spirit and scope of the present invention, as defined in the appended claims.

What is claimed is:

1. A power frequency magnetic field (PF-MF) detector system for characterizing the operational condition of a remote facility responsive to time-varying magnetic fields generated by electrical transmission lines associated with the remote facility, comprising:
    a PF-MF sensor which generates N time-varying magnetic field data sets; and
    a PF-MF analyzer which generates an operational condition assessment responsive to the N time-varying magnetic field data sets,
    wherein N is an integer greater than or equal to 1.

2. The PF-MF detector system as recited in claim 1, further comprising:
    an accumulator which stores and forwards the N time-varying magnetic field data sets via a communications channel to the PF-MF analyzer; and
    the communications channel, which electrically couples the accumulator to the PF-MF analyzer.

3. The PF-MF detector system as recited in claim 1, further comprising:
    an accumulator operatively coupled to the PF-MF analyzer which stores and forwards the N time-varying magnetic field data sets to the PF-MF analyzer; and
    a communications channel operatively coupling the PF-MF sensor to the accumulator.

4. The PF-MF detector system as recited in claim 3, wherein the communication channel passes each of the N time-varying magnetic field data sets to the accumulator in real time.

5. The PF-MF detector system as recited in claim 3, wherein:
    the accumulator comprises a tape recorder; and
    the communications channel comprises a cable connecting the PF-MF sensor to the accumulator.

6. The PF-MF detector system as recited in claim 5, wherein the PF-MF sensor is suspended by an aircraft.

7. The PF-MF detector system as recited in claim 1, wherein the transmission lines are underground transmission lines.

8. The PF-MF detector system as recited in 1, wherein the N time-varying magnetic field data sets required to complete the operational condition assessment increases as the distance between the PF-MF sensor and the transmission lines increases.

9. The PF-MF detector system as recited in claim 1, further comprising:
    a second PF-MF sensor generating M time-varying magnetic field data sets;
    an accumulator which stores and forwards the N+M time-varying magnetic field data sets via a communications channel to the PF-MF analyzer; and
    the communications channel, which electrically couples the accumulator to the PF-MF analyzer,
    wherein:
        the PF-MF analyzer generates the operational condition assessment responsive to the N+M time-varying magnetic field data sets; and
        M is an integer greater than or equal to 1.

10. The PF-MF detector system as recited in claim 1, wherein at least two of the N time-varying magnetic field data sets correspond to before and after time-varying magnetic field data sets obtained prior to and subsequent to a predetermined event, respectively.

11. A method for detecting the operational status of electrical equipment disposed at a remote location responsive to power frequency magnetic field (PF-MF) data generated by at least one electrical source providing power to the electrical equipment, comprising:
    obtaining a series of a N time-varying magnetic field data sets corresponding to the time-varying magnetic fields generated by the electrical source; and
    analyzing the N time-varying magnetic field data sets to thereby produce an operational condition assessment regarding the electrical equipment,
    where N is an integer greater than or equal to 1.

12. The method as recited in claim 11, further comprising:
    positioning a PF-MF sensor proximate to the electrical source,
    wherein the positioning step is performed prior to performing the obtaining step.

13. The method as recited in claim 11, further comprising:
    positioning a PF-MF sensor above the electrical source,
    wherein the positioning step is performed prior to performing the obtaining step.

14. The method as recited in claim 11, further comprising:
    positioning a PF-MF sensor above the electrical source,
    wherein the positioning step and the obtaining step are performed concurrently.

15. The method as recited in claim 14, wherein the electrical source is disposed underground.

16. The method as recited in claim 14, wherein the PF-MF sensor is provided on an airborne platform.

17. The method as recited in claim 11, wherein the PF-MF data is indicative of time-varying magnetic fields generated by power in a frequency range from about 40 to about 800 Hertz.

18. A method for detecting the operational status of electrical equipment disposed at a remote location responsive to power frequency magnetic field (PF-MF) data generated by a PF-MF sensor disposed within the time-varying magnetic fields generated by at least one electrical source providing power to the electrical equipment, comprising:
    moving the PF-MF sensor relative to the electrical source,
    obtaining a series of N time-varying magnetic field data sets corresponding to the time-varying magnetic fields generated by the electrical source; and
    analyzing the N time-varying magnetic field data sets to thereby produce an operational condition assessment regarding the electrical equipment,
    where N is an integer greater than or equal to 1.

19. The method as recited in claim 18, wherein the PF-MF sensor is vertically separated from the electrical source by a predetermined distance.

20. The method as recited in claim 19, wherein the N time-varying magnetic field data sets required to determine the operational status increases as the predetermined distance increases.

21. The method as recited in claim 18, wherein the PF-MF sensor is provided on an airborne platform.

22. The method as recited in claim 18, wherein the PF-MF data is indicative of time-varying magnetic fields generated by power in a frequency range from about 40 to about 800 Hertz.

* * * * *